United States Patent [19]

Jones

[11] Patent Number: 5,343,862
[45] Date of Patent: Sep. 6, 1994

[54] NMR SHOULDER COIL

[75] Inventor: Randall W. Jones, Elkhorn, Nebr.

[73] Assignee: Board of Regents of the Univ. of Nebraska, Lincoln, Nebr.

[21] Appl. No.: 105,455

[22] Filed: Aug. 10, 1993

[51] Int. Cl.$^5$ ............................................. A61B 5/055
[52] U.S. Cl. ................... 128/653.5; 324/318; 324/322
[58] Field of Search .......................... 128/653.2, 653.5; 324/318, 322

[56] References Cited

U.S. PATENT DOCUMENTS 5,136,244 8/1992 Jones et al. ..................... 324/318
5,143,068 9/1992 Muennemann et al. .......... 128/653.5

Primary Examiner—Ruth S. Smith
Attorney, Agent, or Firm—Zarley, McKee, Thomte Voorhees & Sease

[57] ABSTRACT

A shoulder coil of the present invention includes a generally ring-shaped transverse housing oriented in a vertical plane with a parallel wound solenoid supported therein. Annular anterior and posterior housings are mounted diametric on said transverse housing and perpendicularly thereto, and have antenna loops supported therein. The anterior and posterior housings are preferably mounted in planes which diverge downwardly at an angle of approximately 30° from parallel to one another. The transverse housing is a generally cylindrical shaped strap having opposite side edges, with the lower half of the transverse housing folded such that the side edges are abutting to form a joined edge. The anterior, posterior, and transverse housing are preferably formed of a resilient semi-flexible plastic material with the loop antennas and solenoid embedded therein such that the housings may be manipulated and formed to provide a garment-like fit on the shoulder of a patient.

6 Claims, 1 Drawing Sheet

NMR SHOULDER COIL

TECHNICAL FIELD

The present invention relates generally to magnetic resonance imaging (MRI) and more particularly to local coils for use in receiving MRI signals.

BACKGROUND OF THE INVENTION

Nuclear magnetic resonance (NMR) refers generally to one form of gyromagnetic spectroscopy which is conducted to study nuclei that have magnetic moments. Any nucleus which possesses a magnetic moment attempts to align itself with the direction of the magnetic field in which it is located. The nucleus precesses around the direction of the magnetic field at a characteristic angular frequency known as the Larmor frequency. The Larmor frequency is dependent upon the strength of the magnetic field and on the properties of the specific nuclear species.

Subjecting human tissue to a uniform magnetic field will cause the individual magnetic moments of the paramagnetic nuclei in the tissue to attempt to align with this magnetic field, but will precess about it in random order at their characteristic Larmor frequency. If the tissue is irradiated with a magnetic field (excitation field $B_1$) which is in the perpendicular plane relative to the direction of the polarizing field $B_z$, and which is near the Larmor frequency, the net aligned moment $M_z$, can be rotated into the perpendicular plane (x-y plane) to produce a net transverse magnetic moment $M_1$ which is rotated in the x-y plane at the Larmor frequency. Once the magnetic field (excitation field $B_1$) is terminated, an oscillating sine wave (referred to as an NMR signal) is induced in a receiving coil by the rotating field produced by the transverse magnetic moment $M_1$. The frequency of the signal is the Larmor frequency, and its magnitude is determined by the magnitude of $M_1$.

A weak nuclear magnetic resonance generated by the precessing nuclei may be sensed by an RF coil and recorded as an NMR signal. From this NMR signal, a slice image may be derived according to well known reconstruction techniques. The quality of the image produced by the MRI techniques is dependent, in part, on the strength of the NMR signal received from the precessing nuclei. For this reason, an independent RF receiving coil is placed in close proximity to the region of interest of the imaged object to improve the strength of this received signal. Such coils are referred to as "local coils" or "surface coils".

"Whole body" NMR scanners are sufficiently large to receive an entire human body, and to produce an image of any portion thereof. Such whole body scanners may employ an excitation coil for producing the excitation field and a separate receiver coil for receiving the NMR signal. The excitation coil produces a highly uniform excitation field throughout the entire area of interest, whereas the receiver coil is placed near the immediate area of interest to receive the NMR signal.

The smaller area of the local coils permit them to accurately focus on NMR signal from the region of interest. The smaller size of the local coil makes it important that the local coil be accurately positioned near the region of interest. For "whole volume" coils, employing two antenna loops to receive the NMR signal from a volume defined between the loops, accurate positioning of the coils is particularly important. This leads to the development of local coils which conform to the anatomy of interest, yet function to permit ease of use.

SUMMARY OF THE INVENTION

It is therefore an object of the present invention to provide an improved NMR local coil designed to conform to a patient's shoulder region on a variety of patient sizes.

Yet another object is to provide an NMR local coil which is operable to permit ease of patient entrance into the coil set.

Still another object of the present invention is to provide an NMR local coil with a coil form geometry which has been formed to facilitate close coupling of the imaging coil's region of sensitivity to the shoulder region of a patient.

These and other objects will be apparent to those skilled in the art.

The NMR shoulder coil of the present invention includes a generally ring-shaped transverse housing oriented in a vertical plane with a parallel wound solenoid supported therein. Annular anterior and posterior housings are mounted perpendicularly and diametric on said transverse housing and have antenna loops supported therein. The anterior and posterior housings are preferably mounted in planes which are approximately 30° from parallel to one another and diverge downwardly. The transverse housing is a generally cylindrical shaped strap having opposite side edges, with the lower half of the transverse housing folded such that the side edges are abutting to form a joined edge. The anterior, posterior, and transverse housing are preferably formed of a resilient semi-flexible plastic material with the loop antennas and solenoid embedded therein such that the housings may be manipulated and formed to provide a garment-like fit on the shoulder of a patient.

DESCRIPTION OF THE PREFERRED EMBODIMENT

Figure 1:
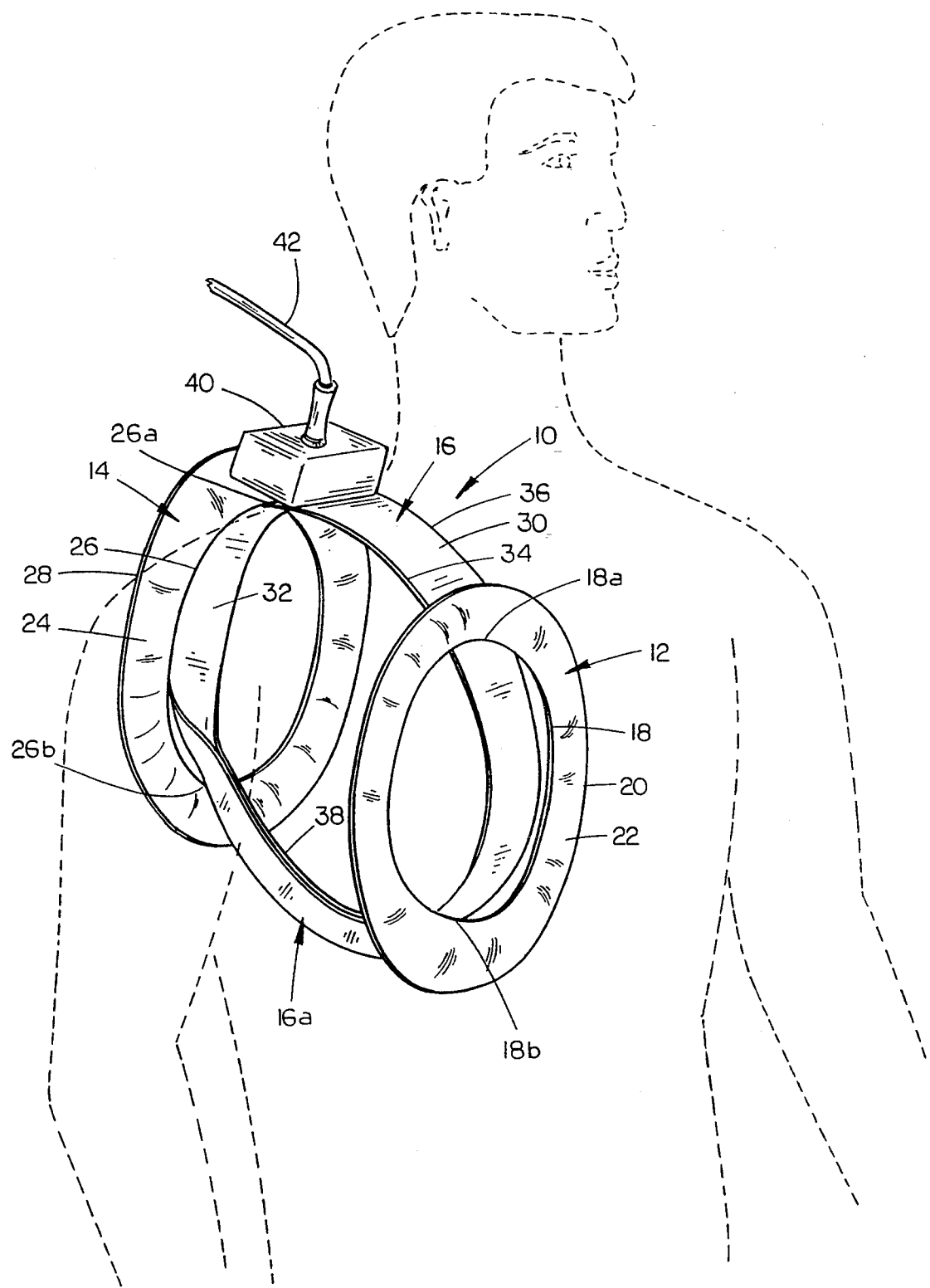
FIG. 1 is a perspective view of the NMR shoulder coil of the present invention, with a patient shown in broken lines.

Referring now to the drawing, the NMR shoulder coil of the present invention is designed generally at 10 and includes opposed anterior and posterior generally annular housings 12 and 14, respectively, separated by transverse annular housing 16.

Annular housing 12 is a generally planar annulus having coplanar inner and outer edges 18 and 20, a planar forward wall 22 and a planar rearward wall (not shown). Anterior housing 12 is formed from a resilient semi-flexible plastic with a multiple-turn inductor loop antenna embedded therein for connection to the NMR equipment. Preferably, a semi-flexible circuit board material or flexible conductor is utilized to form the loop antenna, to permit a garment-like fit of the antenna to the patient.

Posterior housing 14 is essentially identical to anterior housing 12, and is spaced approximately 30° from parallel thereto by transverse housing 16. Posterior housing 14 is a planar annulus having a planar forward wall 24 and coplanar inner and outer edges 26 and 28 respectively. Posterior housing 14 is formed of a resilient generally semi-flexible plastic with a multi-turn inductor loop antenna embedded therein for connection to NMR imaging equipment.

Transverse housing 16 is also formed of a resilient semi-flexible plastic material with a parallel wound solenoid embedded therein and electrically connected to the NMR imaging equipment. Transverse housing 16 is a generally ring-shaped member oriented in a generally vertical plane transverse to the planes of anterior and posterior housings 12 and 14, and includes an outer generally cylindrical wall 30, an inner generally cylindrical wall 32 parallel to outer wall 30 and a pair of opposing side edges 34 and 36.

Housing 16 is mounted to anterior and posterior housings 12 and 14 at the intersection of outer wall 30 with the inner edges 18 and 26 respectively of anterior and posterior housings 12 and 14 respectively. As shown in the drawings, the intersection of transverse housing 16 with anterior housing 12 occurs at generally diametric portions of inner edge 18, designated at 18a and 18b, respectively. Similarly, outer wall 30 of housing 16 is mounted to posterior housing 14 at diametric portions of inner edge 26, designated at 26a and 26b respectively.

The lower half of transverse housing 16 is folded such that lengths of side edges 34 and 36 are abutting one another to form a joined edge 38. Joined edge 38 forms an arcuate generally bulbous section 16a of transverse housing 16 which extends generally between the lower intersections 18b and 26b of housing 16 with anterior and posterior housings 12 and 14.

A box 40 is mounted to the outer wall 30 of transverse housing 16 and a portion of the forward wall 24 of posterior housing 14 and houses electronic circuitry for operating the inductor loops and solenoid embedded within housings 12, 14 and 16. An electrical cable 42 extending from box 40 electrically connects shoulder coil 10 with the NMR imaging equipment.

In operation, a patient will extend an arm through the opening formed by transverse housing 16 with anterior housing 12 located against the patient's chest. The bulbous section 16a of transverse housing 16 rests within the armpit of the patient and provides high sensitivity to the most inferior aspect of the shoulder joint with minimal discomfort. Posterior housing 14 is located generally parallel to, and preferably diverging from, anterior housing 12 on the opposing side of the patient's body, with box 40 connected to the portion of transverse housing 16 resting on the top of the shoulder. The resilient semi-flexibility of housings 12, 14 and 16 permits accurate positioning of the shoulder coil 10 so as to closely conform to the anatomy of the shoulder.

Whereas the invention has been shown and described in connection with the preferred embodiments thereof, it will be understood that many modifications, substitutions and additions may be made which are within the intended broad scope of the appended claims. There has therefore been shown and described an improved NMR shoulder coil which accomplishes at least all of the above stated objects.

I claim:

1. A shoulder coil, comprising:
    a generally annular anterior housing supporting a first antenna loop;
    a generally ring-shaped transverse housing oriented in a vertical plane and mounted to said anterior housing to support the anterior housing in a slightly off-vertical plane, said transverse housing supporting a solenoid therein; and
    a generally annular posterior housing supporting a second antenna loop, mounted on said transverse housing diametric to said anterior housing in a slightly off-vertical plane.

2. The shoulder coil of claim 1, wherein said anterior and posterior housings are mounted approximately 30° from parallel to one another.

3. The shoulder coil of claim 1, wherein said transverse housing includes an upper half and a lower half and wherein said anterior and posterior housings are mounted to said transverse housing in downwardly diverging planes.

4. The shoulder coil of claim 3, wherein said transverse housing includes an outer generally cylindrical wall, an inner generally cylindrical wall parallel to the outer wall, and a pair of opposing side edges; and wherein said lower half is folded such that said side edges of the lower half are abutting to form a joined edge.

5. The shoulder coil of claim 1, further comprising a box mounted on the upper half of said transverse housing, enclosing electronic circuitry electrically connected to said antenna loops and solenoid for operating the same.

6. The shoulder coil of claim 1, wherein said anterior and posterior housings are formed of a resilient, semi-flexible plastic material with said antenna loops embedded therein, and said transverse housing is formed of a resilient, semi-flexible plastic material with a parallel wound solenoid embedded therein, such that said housings may be manually moved and formed to provide a garment-like fit on the shoulder of a patient.

* * * * *